US012690330B2

(12) United States Patent
Choi et al.

(10) Patent No.: US 12,690,330 B2
(45) Date of Patent: Jul. 21, 2026

(54) DISPLAY DEVICE

(71) Applicant: Samsung Display Co., Ltd., Yongin-Si (KR)

(72) Inventors: Nakcho Choi, Yongin-si (KR); Dae-Gi Kweon, Hwaseong-si (KR); Jihee Kim, Suwon-si (KR); Donghyun Son, Seoul (KR); Yun-Kyeong In, Hwaseong-si (KR); Jungmin Choi, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 892 days.

(21) Appl. No.: 17/863,655

(22) Filed: Jul. 13, 2022

(65) Prior Publication Data

US 2023/0055469 A1     Feb. 23, 2023

(30) Foreign Application Priority Data

Aug. 19, 2021     (KR) ........................ 10-2021-0109490

(51) Int. Cl.
*H10K 59/122*     (2023.01)
(52) U.S. Cl.
CPC ................................. *H10K 59/122* (2023.02)
(58) Field of Classification Search
None
See application file for complete search history.

(56) References Cited

U.S. PATENT DOCUMENTS

| | | | |
|---|---|---|---|
| 2012/0049215 A1 | 3/2012 | Yoon et al. | |
| 2016/0013260 A1* | 1/2016 | Ahn | H10K 59/126 |
| | | | 438/34 |
| 2017/0214003 A1* | 7/2017 | Lee | H10K 59/121 |
| 2020/0105844 A1* | 4/2020 | Wang | H10K 59/131 |
| 2020/0365674 A1 | 11/2020 | Jeon et al. | |
| 2021/0066648 A1* | 3/2021 | Chung | H10K 59/122 |
| 2021/0111232 A1 | 4/2021 | Park et al. | |
| 2021/0126069 A1* | 4/2021 | Kim | H10K 59/123 |
| 2021/0183296 A1* | 6/2021 | Lee | G09G 3/32 |
| 2021/0191552 A1* | 6/2021 | Bok | G06F 1/1681 |
| 2021/0193782 A1* | 6/2021 | Seo | H10K 59/131 |
| 2021/0202900 A1* | 7/2021 | Lee | H10K 50/844 |

(Continued)

FOREIGN PATENT DOCUMENTS

| | | |
|---|---|---|
| KR | 10-2012-0019026 A | 3/2012 |
| KR | 10-2020-0090299 A | 7/2020 |

(Continued)

OTHER PUBLICATIONS

IP.com.*

*Primary Examiner* — Fatima N Farokhrooz
(74) *Attorney, Agent, or Firm* — Innovation Counsel LLP

(57) ABSTRACT

A display device is disclosed that includes a substrate, a conductive layer, and a pixel defining layer. The substrate includes a first display area including pixels, a second display area including the pixels, and a transmissive area formed between the pixels of the second display area. The conductive layer is disposed in the second display area outside of the transmissive area. The pixel defining layer overlaps the conductive layer and is disposed such that an end of the pixel defining layer adjacent to the transmissive area is substantially aligned with an end of the conductive layer adjacent to the transmissive area.

13 Claims, 18 Drawing Sheets

(56) References Cited

U.S. PATENT DOCUMENTS

| | | | |
|---|---|---|---|
| 2021/0225958 A1* | 7/2021 | Ko | H10K 59/351 |
| 2021/0241671 A1* | 8/2021 | Lee | G09G 3/3225 |
| 2021/0249635 A1* | 8/2021 | Cho | H10K 59/121 |
| 2021/0359276 A1* | 11/2021 | Inari | H10K 50/86 |

FOREIGN PATENT DOCUMENTS

| | | | |
|---|---|---|---|
| KR | 10-2020-0102580 A | 9/2020 | |
| KR | 10-2020-0131397 A | 11/2020 | |
| KR | 10-2021-0043792 A | 4/2021 | |
| KR | 10-2021-0142808 A | 11/2021 | |
| KR | 10-2022-0041286 A | 4/2022 | |
| KR | 10-2022-0053756 A | 5/2022 | |

* cited by examiner

F I G . 4
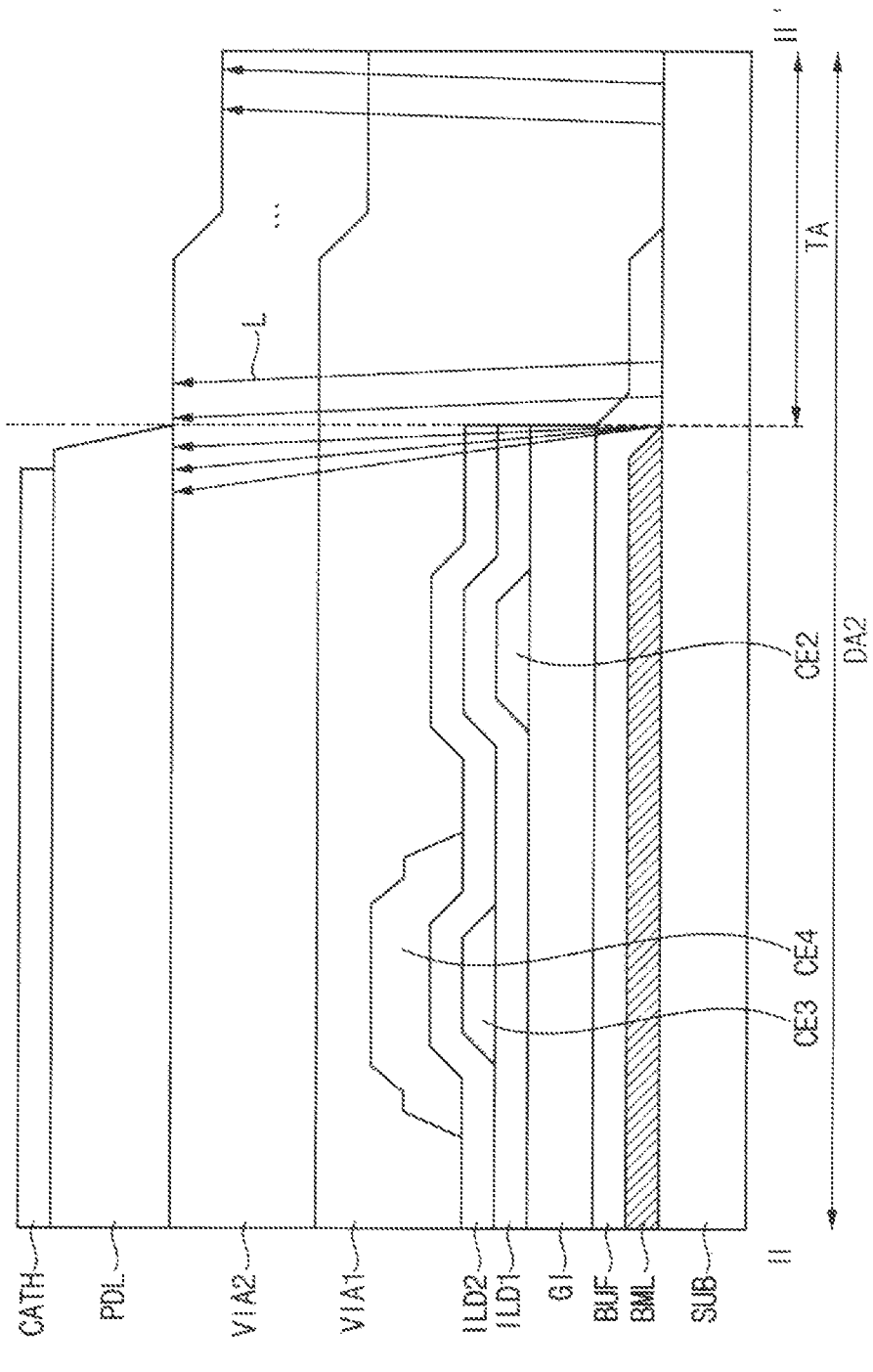

F I G .  1 0
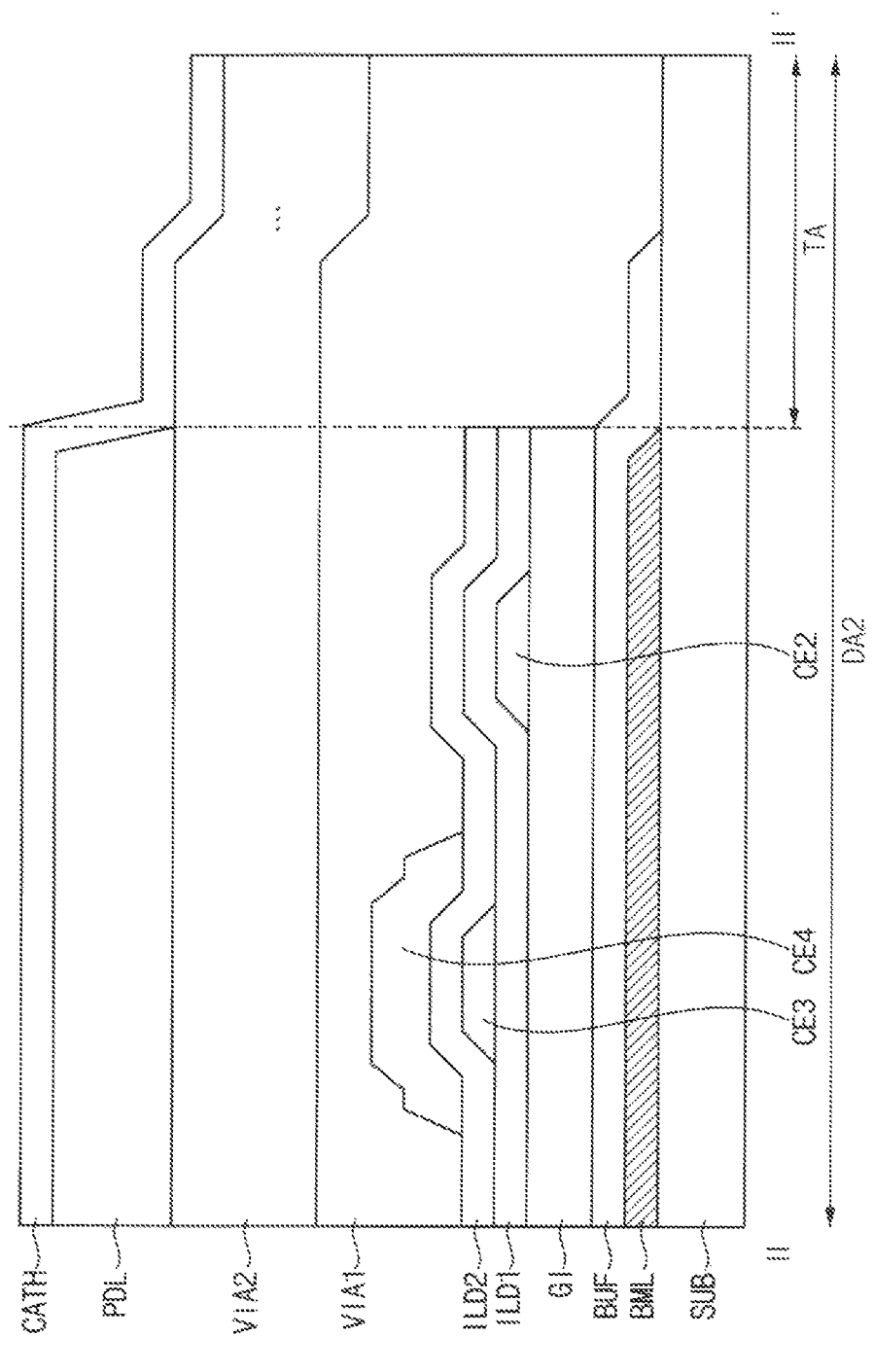

F I G. 12
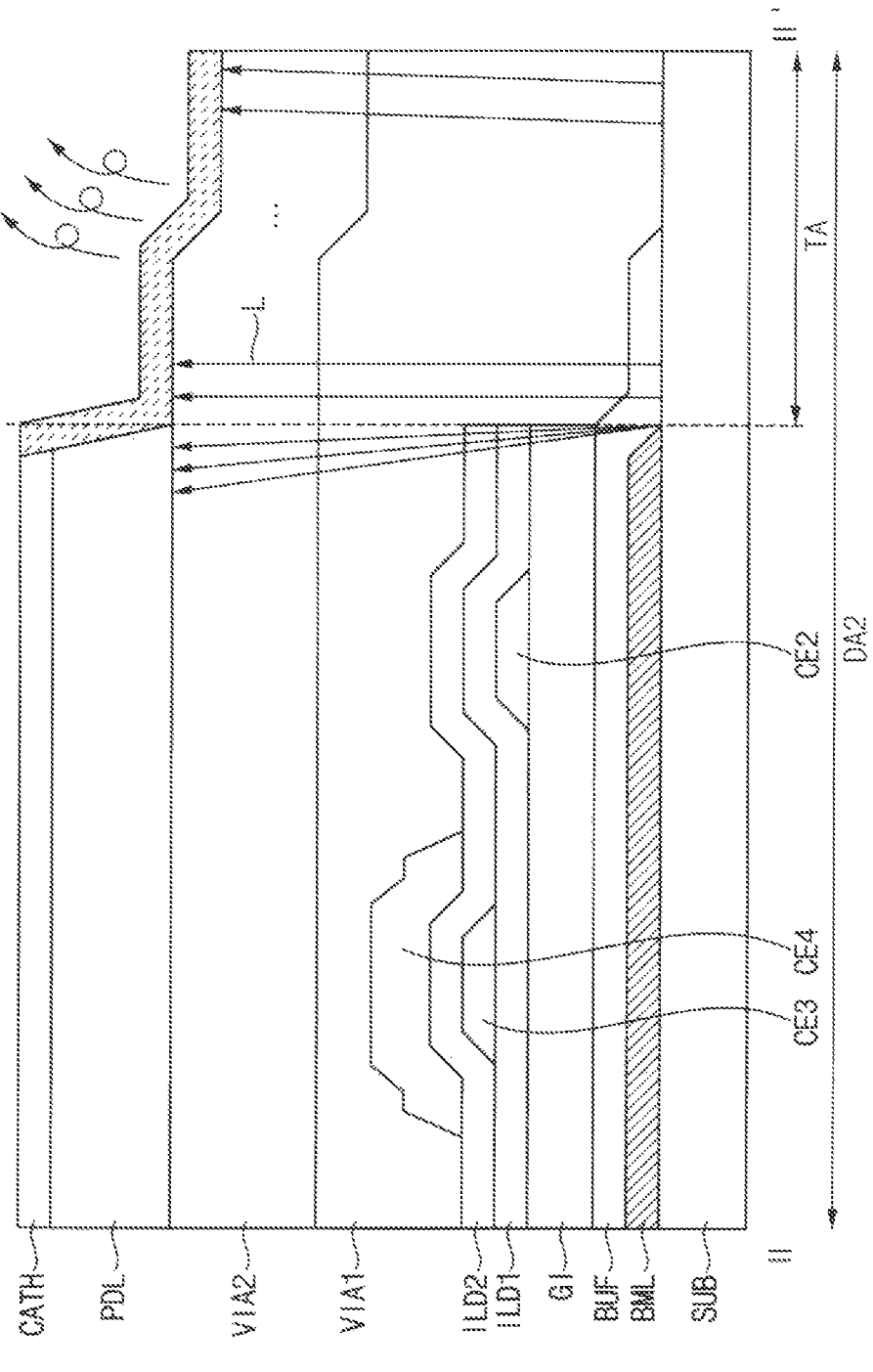

DISPLAY DEVICE

This application claims priority to Korean Patent Application No. 10-2021-0109490 filed on Aug. 19, 2021, and all the benefits accruing therefrom under 35 U.S.C. § 119, which is hereby incorporated by reference for all purposes as if fully set forth herein.

BACKGROUND

1. Field

The present inventive concept relates to a display device. More particularly, the present inventive concept relates to a display device including a conductive layer.

2. Description of the Related Art

A display device is manufactured and used in various ways. The display device may display light to provide visual information to the user. The display device may include a liquid crystal display device that emits light using a liquid crystal layer, an inorganic light emitting display device that emits light using an inorganic light emitting material, and an organic light emitting display device that emits light using an organic light emitting material.

The display device not only displays an image by emitting light, but also recognizes light and stores it as an image. For example, a functional module disposed in the display device may recognize and store the light. In this case, a space for the functional module to recognize light may be formed in the display device, and thus, an area of the display area from which the display device emits light may be reduced.

Recently, research has been conducted to recognize external light through a functional module without reducing the area of the display area where the display device emits light.

SUMMARY

An embodiment of a display device may include a substrate that includes a first display area including pixels, a second display area including the pixels, and a transmissive area formed between the pixels of the second display area, a conductive layer disposed in the second display area outside of the transmissive area, and a pixel defining layer overlapping the conductive layer and disposed such that an end of the pixel defining layer adjacent to the transmissive area is substantially aligned with an end of the conductive layer adjacent to the transmissive area.

In an embodiment, the pixel defining layer may include a black organic pigment.

In an embodiment, the black organic pigment may include a lactam pigment.

In an embodiment, the end of the pixel defining layer and the end of the conductive layer may be aligned with a line extending at a right angle from the substrate.

In an embodiment, the end of the pixel defining layer may protrude into the transmissive area relative to a line extending at a right angle from the substrate aligned with the end of the conductive layer.

In an embodiment, a length of a portion from which the end of the pixel defining layer may protrude no more than about 2 micrometers.

In an embodiment, the end of the pixel defining layer may be spaced apart from the transmissive area relative to a line extending at a right angle from the substrate aligned with the end of the conductive layer.

In an embodiment, a length of a portion from which the end of the pixel defining layer may be spaced apart is no more than about 2 micrometers.

In an embodiment, the display device may further include a cathode electrode disposed on the pixel defining layer to overlap the second display area and not to overlap the transmissive area.

In an embodiment, the display device may further include a plurality of inorganic insulating layers disposed on the conductive layer to overlap the second display area and not to overlap the transmissive area.

In an embodiment, the display device may further include a first organic insulating layer disposed on the plurality of inorganic insulating layers to overlap the second display area and extended to overlap the transmissive area as well and a second organic insulating layer disposed on the first organic insulating layer to overlap the second display area and the transmissive area.

In an embodiment, the display device may further include a plurality of inorganic insulating layers disposed on the conductive layer to overlap the second display area and extending so that an end thereof overlaps a portion of the transmissive area.

In an embodiment, the display device may further include a first organic insulating layer disposed on the plurality of inorganic insulating layers to overlap the second display area and extended to overlap the transmissive area and a second organic insulating layer disposed on the first organic insulating layer to overlap the second display area and the transmissive area.

In an embodiment, the display device may further include a first inorganic insulating layer disposed on the conductive layer to overlap the second display area and extending so that an end of the first inorganic insulating layer overlaps a portion of the transmissive area and a second inorganic insulating layer disposed on the first inorganic insulating layer to overlap the second display area and not overlapping the transmissive area.

In an embodiment, the display device may further include a first organic insulating layer disposed on the second inorganic insulating layers to overlap the second display area and extended to overlap the transmissive area as well and a second organic insulating layer disposed on the first organic insulating layer to overlap the second display area and the transmissive area.

In an embodiment, the display device may further include a driving element disposed on the first display area and the second display area of the substrate and a light emitting element disposed on the driving element and electrically connected to the driving element.

In an embodiment, the light emitting element may include an anode electrode electrically connected to the driving element, a light emitting layer disposed on the anode electrode and a cathode electrode disposed on the light emitting layer and the pixel defining layer, overlapping the pixel defining layer in the first display area and the second display area, and not overlapping the transmissive area.

An embodiment of a display device may include a substrate including a first display area including a plurality of pixels, and a second display area including the plurality of pixels and a transmissive area formed between the plurality of pixels, a conductive layer disposed on the second display area of the substrate and not disposed on the transmissive area and a pixel defining layer overlapping the conductive layer on the conductive layer and disposed such that an end of the pixel defining layer adjacent to the transmissive area is aligned with an end of the conductive layer adjacent to the transmissive area.

It is to be understood that both the foregoing general description and the following detailed description are explanatory and are intended to provide further explanation of the present inventive concept.

BRIEF DESCRIPTION OF THE DRAWINGS

The accompanying drawings, which are included to provide a further understanding of the present inventive concept and are incorporated in and constitute a part of this specification, illustrate embodiments of the present inventive concept, and together with the description serve to explain the embodiments.

FIG. 4 is a cross-sectional view illustrating an embodiment of a cross-section taken along line II-II' of FIG. 2.

FIG. 5 is a cross-sectional view illustrating an embodiment of a cross-section taken along line II-II' of FIG. 2.

FIG. 6 is a cross-sectional view illustrating an embodiment of a cross-section taken along line II-II' of FIG. 2.

FIG. 7 is a cross-sectional view illustrating an embodiment of a cross-section taken along line II-II' of FIG. 2.

FIG. 8 is a cross-sectional view illustrating an embodiment of a cross-section taken along line II-II' of FIG. 2.

FIGS. 10, 11, 12 and 13 are cross-sectional views illustrating an embodiment in which a laser is irradiated to a cathode electrode.

DETAILED DESCRIPTION

Figure 1:
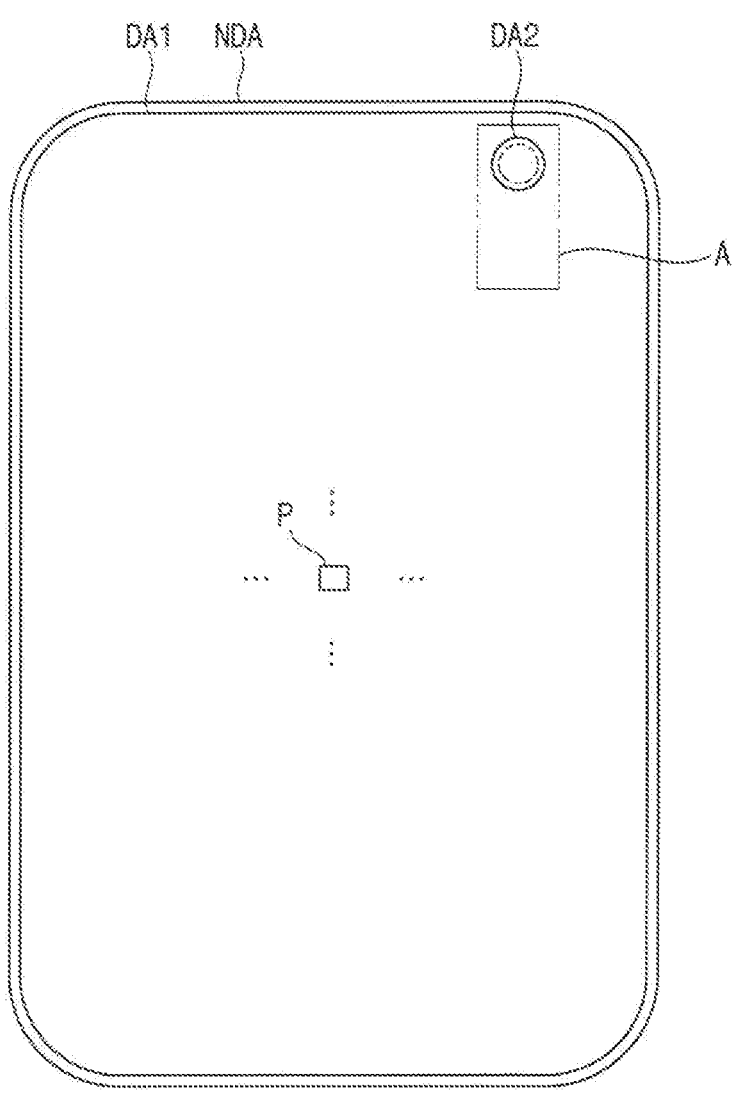
FIG. 1 is a plan view illustrating an embodiment of a display device.

Embodiments of a display device include a transmission area for a functional module, such as a camera, in which the transmission area has an improved light transmission. During manufacture, a cathode electrode that extends into or covers the transmission area may be removed using a laser by illuminating the cathode electrode in the transmission area. The light transmission may be improved by substantially aligning ends of a pixel defining layer and a conductive layer at an edge of the transmission area.

Embodiments of the present inventive concept will now be described more fully hereinafter with reference to the accompanying drawings. This present inventive concept may, however, be embodied in many different forms, and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout. As used herein, a reference number may indicate a singular element or a plurality of the element. For example, a reference number labeling a singular form of an element within the drawing figures may be used to reference a plurality of the singular element within the text of specification.

Illustrative, non-limiting embodiments will be more clearly understood from the following detailed description in conjunction with the accompanying drawings.

FIG. 1 is a plan view illustrating an embodiment of a display device.

Referring to FIG. 1, the display device may include display areas DA1 and DA2 and a non-display area NDA.

The display device may display an image in the display areas DA1 and DA2. To this end, a plurality of pixels P may be disposed in the display areas DA1 and DA2. The plurality of pixels P may be arranged in various ways. For example, the plurality of pixels P may be generally disposed in the display areas DA1 and DA2 in a matrix form.

The number of pixels P disposed per unit area of the first display area DA1 may be different from the number of pixels P disposed per unit area of the second display area DA2. In some embodiments, the second display area DA2 may be an area in which a functional module is disposed. Since light needs to be transmitted to the functional module, a smaller number of pixels may be disposed in the unit area of the second display area DA2 than the unit area of the first display area DA1. An area in which the pixels P are not disposed among the second display area DA2 may be defined as a transmissive area. To this end, the arrangement structure of the transmissive area may be different from the structure of the area in which the pixels P are arranged in the second display area DA2.

Drivers may be disposed in the non-display area NDA. The driver may be components that assist in driving the pixels P to display an image. For example, the drivers may include a data driver, a scan driver, a light emitting driver, a driving chip, and the like.

Although each corner of the display device is illustrated in a rounded shape in FIG. 1, the shape of the display device may not be limited thereto. For example, each corner of the display device may have an angled shape. Alternatively, the display device may have an overall circular shape.

Figure 2:
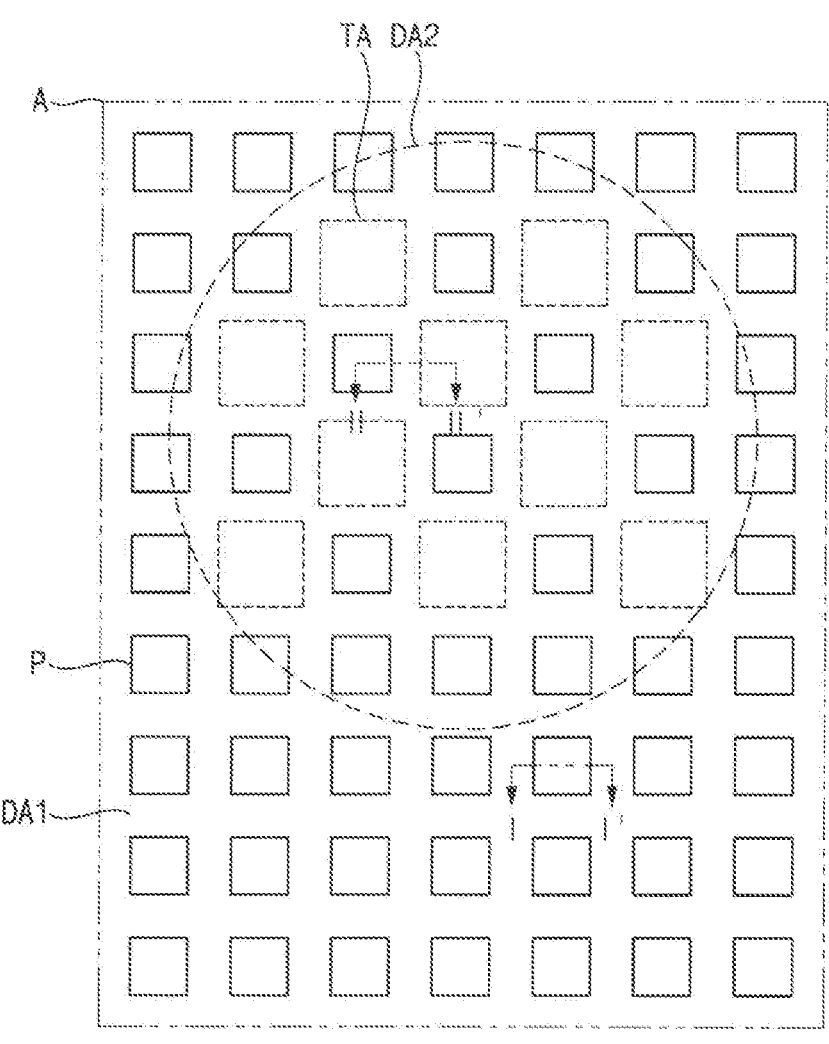
FIG. 2 is an enlarged view of a part A of a display area of the display device of FIG. 1.

FIG. 2 is an enlarged view of a part A of a display area of the display device of FIG. 1.

Referring to FIG. 2, the second display area DA2 may be defined as an area in which pixels per unit area is less than the pixels per unit area in the first display area DAL An area in which a conductive layer is not disposed within the second display area DA2 may be defined as the transmissive area TA.

The transmissive area TA may have improved transmittance compared to other areas. To this end, the transmissive area TA may have fewer components than other areas.

Figure 3:
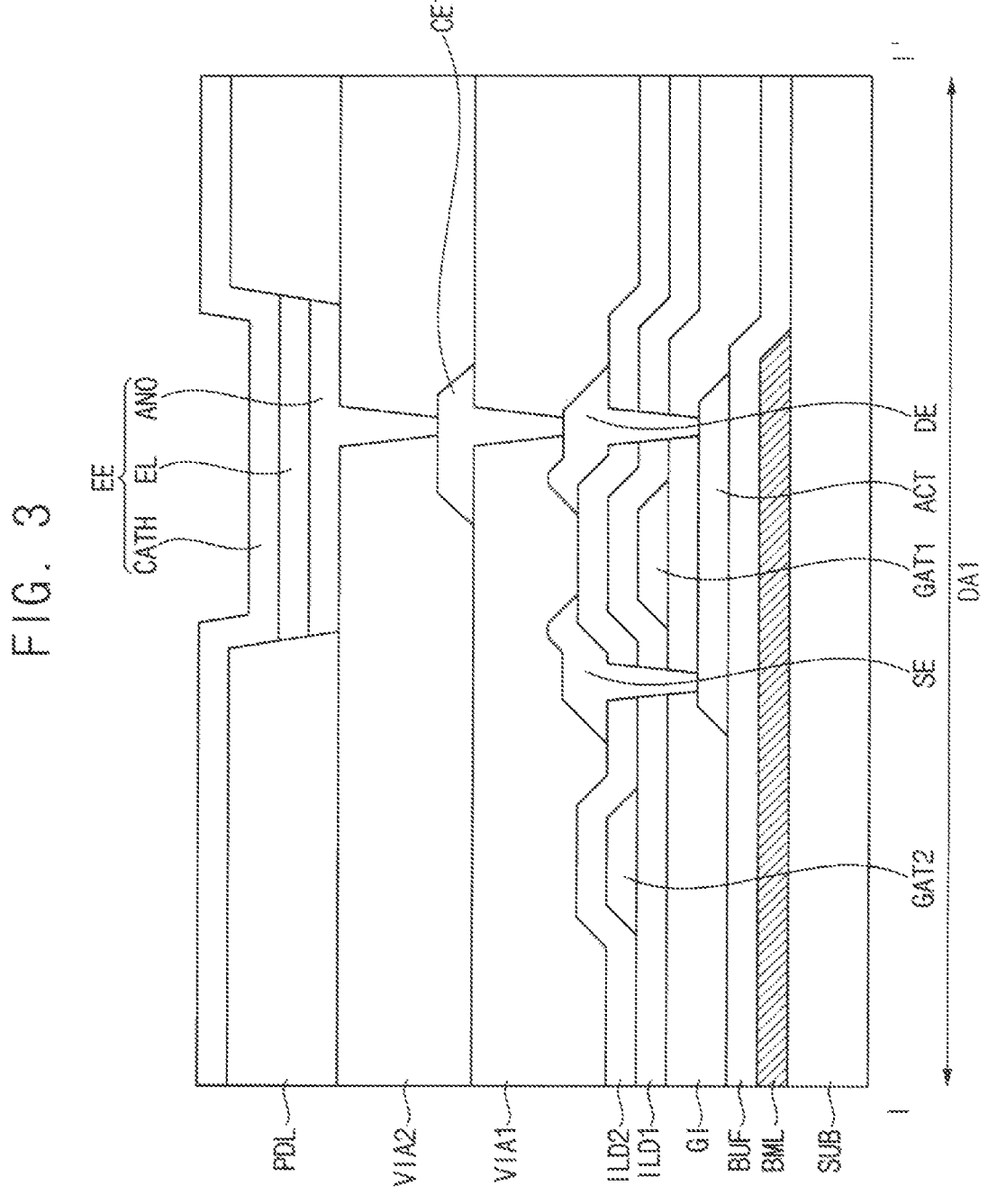
FIG. 3 is a cross-sectional view illustrating an embodiment of a cross-section taken along line I-I' of FIG. 2.

FIG. 3 is a cross-sectional view illustrating an embodiment of a cross-section taken along line I-I' of FIG. 2.

Referring to FIG. 3, the display device may include a substrate SUB, a conductive layer BML, a buffer layer BUF, a gate insulating layer GI, a transistor, a first interlayer insulating layer ILD1, a second interlayer insulating layer ILD2, a second gate electrode GAT2, a first via insulating layer VIA1, a second via insulating layer VIA2, a first connection electrode CE1, a pixel defining layer PDL, and a light emitting element EE. The transistor may include an active layer ACT, a first gate electrode GAT1, a source electrode SE, and a drain electrode DE. The light emitting element EE may include an anode electrode ANO, an light emitting layer EL, and a cathode electrode CATH.

The substrate SUB may include glass or plastic. For example, when the substrate SUB includes glass, the display device may have a rigid characteristic. Alternatively, when the substrate SUB includes plastic, the display device may have a flexible characteristic. Examples of the plastic include polyimide and the like. The substrate SUB may have a structure in which a plurality of layers are stacked. For example, the substrate SUB may have a structure in which a first base substrate, a first barrier layer, a second base substrate, and a second barrier layer are sequentially stacked. Through this, the substrate SUB may protect the components disposed thereon from external foreign substances or impacts. In this case, the first base substrate and the second base substrate may include glass or plastic. The first barrier layer and the second barrier layer may include an inorganic insulating material. The substrate SUB may include a first display area DA1.

The conductive layer BML may be disposed on the substrate SUB. The conductive layer EML may include a conductive material. For example, the conductive layer BML may be formed of a metal, an alloy, a conductive metal oxide, a transparent conductive material, or the like. The conductive layer BML may be disposed to overlap the active layer ACT, and may act as a protective layer to prevent deterioration of electrical characteristics of the active layer ACT constituting the transistor. For example, in the manufacturing process of the display device, the transistor may be protected from the laser L or moisture introduced from a lower portion of the substrate SUB. Specifically, the conductive layer BML may minimize fluctuations in a threshold voltage of the transistor when the laser L irradiated from the lower portion of the substrate SUB flows into the active layer ACT of the transistor. The conductive layer BML may be formed of a metal having low light transmittance. For example, the conductive layer BML may include molybdenum (Mo). The conductive layer BML is generally disposed on the substrate SUB, and may serve to block light incident from the bottom.

The buffer layer BUF may be disposed on the conductive layer BML. The buffer layer BUF may include an insulating material. Examples of the insulating material that may be used as the buffer layer BUF may include silicon oxide (SiOx), silicon nitride (SiNx), silicon oxynitride (SiON), and the like. These may be used alone or in combination with each other. The buffer layer BUF may prevent metal atoms or impurities from diffusing from the substrate SUB to the transistor. In some embodiments, the buffer layer BUF may control a heat transfer rate during a crystallization process for forming the active layer ACT.

The active layer ACT may be disposed on the buffer layer BUF. In an embodiment, the active layer ACT may be formed of a silicon semiconductor or an oxide semiconductor.

Examples of the material that can be used for the silicon semiconductor may include amorphous silicon, polycrystalline silicon, and the like. These may be used alone or in combination with each other.

Examples of materials that can be used as the oxide semiconductor may include zinc oxide (ZnOx), gallium oxide (GaOx), titanium oxide (TiOx), tin oxide (SnOx), indium oxide (InOx), indium-gallium oxide (IGO), Indium-zinc oxide (IZO), indium-tin oxide (ITO), gallium-zinc oxide (GZO), indium-magnesium oxide (ZMO), zinc-tin oxide (ZTO), zinc-zirconium oxide (ZnZrxOy), indium-Gallium-zinc oxide (IGZO), indium-zinc-tin oxide (IZTO), indiumgallium-hafnium oxide (IGHO), tin-aluminum-zinc oxide (TAZO), indium-gallium-tin oxide (IGTO), etc. These may be used alone or in combination with each other.

The gate insulating layer GI may cover the active layer ACT and may be disposed on the buffer layer BUF. The gate insulating layer GI may be formed of an insulating material. For example, examples of the insulating material that may be used as the gate insulating layer GI may include silicon oxide (SiOx), silicon nitride (SiNx), silicon oxynitride (SiON), or the like. These may be used alone or in combination with each other.

The first gate electrode GAT1 may be disposed on the gate insulating layer GI. When a signal is applied to the first gate electrode GAT1, the active layer ACT is activated to allow a signal to flow through the transistor. The first gate electrode GAT1 may be formed of a metal, an alloy, a conductive metal oxide, a transparent conductive material, or the like. For example, examples of materials that can be used as the gate electrode GE may include silver (Ag), an alloy containing silver, molybdenum (Mo), an alloy containing molybdenum, aluminum (Al), alloys containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), and the like. These may be used alone or in combination with each other.

The first interlayer insulating layer ILD1 may cover the first gate electrode GAT1 and may be disposed on the gate insulating layer GI. The first interlayer insulating layer ILD1 may be formed of an insulating material. The first interlayer insulating layer ILD1 may be formed of substantially the same material as the gate insulating layer GI.

The second gate electrode GAT2 may be disposed on the first interlayer insulating layer ILD1. The second gate electrode GAT2 may be formed of substantially the same material as the first gate electrode GAT1. The second gate electrode GAT2 may serve to transmit signals transmitted from the drivers. Alternatively, the second gate electrode GAT2 may constitute a capacitor together with an electrode disposed on the same layer as the first gate electrode GAT1. The above-described transistor and capacitor may be defined as driving elements for driving light emitting elements, respectively.

The second interlayer insulating layer ILD2 may cover the second gate electrode GAT2 and may be disposed on the first interlayer insulating layer ILD1. The first interlayer insulating layer ILD1 may be formed of an insulating material. The second interlayer insulating layer ILD2 may be formed of substantially the same material as the first interlayer insulating layer ILD1.

The source electrode SE and the drain electrode DE may be disposed on the second interlayer insulating layer ILD2. The source electrode SE and the drain electrode DE may contact the active layer ACT. The source electrode SE and the drain electrode DE may be formed of a metal, an alloy, a conductive metal oxide, a transparent conductive material, or the like.

The first via insulating layer VIA1 may cover the source electrode SE and the drain electrode DE, and may be disposed on the first interlayer insulating layer ILD2. The first via insulating layer VIA1 may be formed of an organic insulating material. For example, examples of the material that can be used as the first via insulating layer VIA1 may include a photoresist, a polyacrylic resin, a polyimide resin, and an acrylic resin. etc. These may be used alone or in combination with each other.

The second via insulating layer VIA2 may cover the first connection electrode CE1 and may be disposed on the first via insulating layer VIA1. The second via insulating layer VIA2 may be formed of substantially the same material as the first via insulating layer VIA1.

By disposing the first via insulating layer VIA1 and the second via insulating layer VIA2 together, transmittance may be reduced in a region where the first via insulating layer VIA1 and the second via insulating layer VIA2 are disposed. Accordingly, the polarization layer may not be additionally disposed on the display device.

The anode electrode ANO may be disposed on the second via insulating layer VIA2. The anode electrode ANO may be connected to the transistor by being connected to the first connection electrode CE1 through a contact hole formed by removing a portion of the second via insulating layer VIA2. The anode electrode ANO may be formed of a metal, an alloy, a conductive metal oxide, a transparent conductive material, or the like.

The pixel defining layer PDL may be disposed on the second via insulating layer VIA2 to expose the anode electrode ANO. The pixel defining layer PDL may include an opening exposing the anode electrode ANO. The pixel defining layer PDL may be formed of an organic material. For example, examples of the material that can be used as the pixel defining layer PDL may include photoresist, poly-acrylic resin, polyimide resin (particularly, photosensitive polyimide resin (PSPI)), acrylic resin, black organic pigment, and the like. These may be used alone or in combination with each other. Preferably, a black organic pigment may be used as a material of the pixel defining layer PDL, and examples of the black organic pigment may include a lactam-based pigment.

The light emitting layer EL may be disposed on the anode electrode ANO. The light emitting layer EL may contact the anode electrode ANO in the opening. In some embodiments, the light emitting layer EL may include an organic light emitting layer emitting red light, an organic light emitting layer emitting green light, or an organic light emitting layer emitting blue light. In addition, the light emitting layer EL may further include a hole injection layer, a hole transport layer, an electron injection layer, and an electron transport layer.

The cathode electrode CATH may be disposed on the light emitting layer EL. The cathode electrode CATH may be disposed to cover the light emitting layer EL and the pixel defining layer PDL. The cathode electrode CATH may be generally disposed on the first display area DA1 and the second display area DA2. However, the cathode electrode CATH may not be disposed in the transmission area TA. The cathode electrode CATH may be formed of a metal, an alloy, a conductive metal oxide, a transparent conductive material, or the like.

Although not illustrated for convenience of explanation, the display device may further include an encapsulation layer that protects the light emitting element EE from external impact on the light emitting element EE, a touch sensing layer that detects a touch, and a cover window disposed on the outermost side of the light emitting element EE.

FIG. 4 is a cross-sectional view illustrating an embodiment of a cross-section taken along line II-II' of FIG. 2.

Referring to FIG. 4, the display device may include the substrate SUB, the conductive layer BML, the buffer layer BUF, the gate insulating layer GI, a second connection electrode CE2, a third connection electrode CE3, a fourth connection electrode CE4, the first interlayer insulating layer ILD1, the second interlayer insulating layer ILD2, the first via insulating layer VIA1, the second via insulating layer VIA2, the pixel defining layer PDL, and the cathode electrode CATH.

The substrate SUB may include a second display area DA2 and a transmissive area TA. The substrate SUB may also include the first display area DA1, and the first display area DA1 may be adjacent to the second display area DA2. But, in FIGS. 4 to 9, only the second display area DA2 and the transmissive area TA are illustrated.

The conductive layer BML may be disposed on the substrate SUB. The conductive layer BML may be formed of a material having low light transmittance, and thus, a boundary between the transmissive area TA and the second display area DA2 may be determined by the conductive layer BML. An area in which an end of the conductive layer BML is disposed may be defined as a boundary between the second display area DA2 and the transmissive area TA.

As illustrated in FIG. 4, inorganic insulating layers GI, ILD1, ILD2 excluding the buffer layer BUF may not be disposed in the transmissive area TA. However, this is only an example, and the buffer layer BUF may also be formed not to be disposed on the transmissive area TA. Since the transmissive area TA is an area in which transmittance should be high, inorganic insulating layers may not be disposed.

The conductive layer BML, the buffer layer BUF, and the insulating layers GI, ILD1, ILD2, VIA1, VI2 disposed on the substrate SUB have been described with reference to FIG. 3, and the overlapping configuration will be omitted.

The second connection electrode CE2 may be disposed on the gate insulating layer GI. The second connection electrode CE2 may serve to transmit a signal. The second connection electrode CE2 may be disposed on the same layer and may be simultaneously formed of the same material as the first gate electrode GAT1 described with reference to FIG. 3.

The third connection electrode CE3 may be disposed on the first interlayer insulating layer ILD1. The third connection electrode CE3 may serve to transmit a signal. The third connection electrode CE3 may be disposed on the same layer and may be simultaneously formed of the same material as the second gate electrode GAT2 described with reference to FIG. 3.

The fourth connection electrode CE4 may be disposed on the second interlayer insulating layer ILD2. The fourth connection electrode CE4 may serve to transmit a signal. The fourth connection electrode CE4 may be disposed on the same layer and may be simultaneously formed of the same material as the source electrode SE and the drain electrode DE described with reference to FIG. 3.

During the manufacturing process of the display device, a laser device may irradiate a laser L from a lower portion of the substrate SUB to remove the cathode electrode CATH disposed on the transmissive area TA. In this case, since the conductive layer BML is disposed in the area overlapping the second display area DA2, the laser L may be blocked by the conductive layer BML. However, the laser L may be diffracted into the second display area DA2 at the boundary between the transmissive area TA and the second display area DA2. At this time, the diffracted laser L may not completely remove the cathode electrode CATH because an intensity of light is weakened. Accordingly, a residue of the cathode electrode CATH may remain, which may cause problems such as a short circuit and a defective gap in the display device.

When the pixel defining layer PDL extends to the boundary between the second display area DA2 and the transmissive area TA so that an end of the pixel defining layer PDL is substantially aligned with the end of the conductive layer BML, the diffracted laser L may be prevented from being transmitted to the electrode CATH. Accordingly, it is possible to prevent a residue of the cathode electrode CATH from being generated. Although FIG. 4 illustrates an embodiment in which the end of the pixel defining layer PDL and the end of the conductive layer BML are disposed on a same line, this is illustrative and an embodiment in which the end of the pixel defining layer PDL is substantially aligned with the end of the conductive layer BML is not limited thereto.

Figure 5:
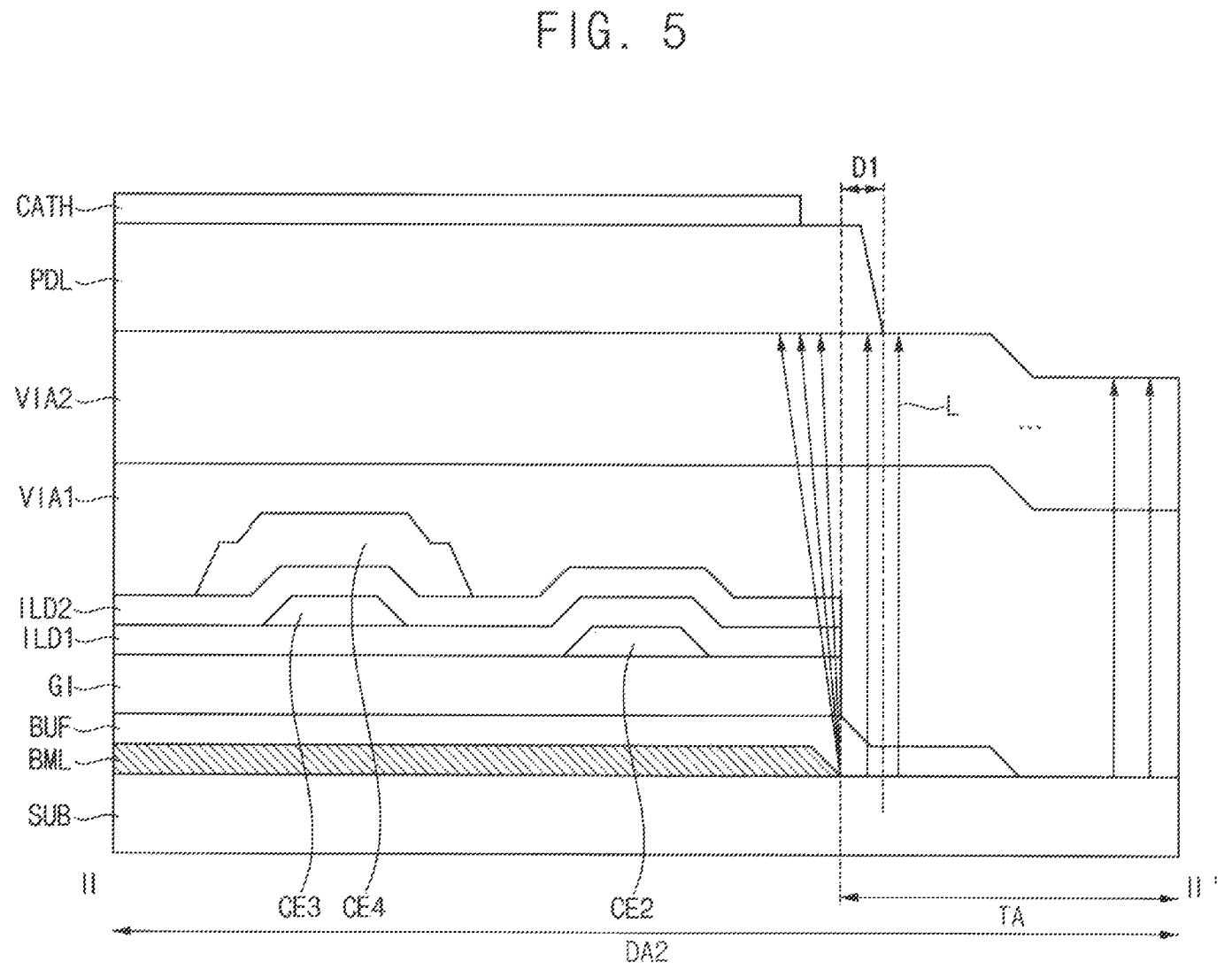

FIG. 5 is a cross-sectional view illustrating an embodiment of a cross-section taken along line II-II' of FIG. 2. FIG. 5 may be substantially the same as FIG. 4, except that an end of the pixel defining layer PDL protrudes into the transmissive area TA. Accordingly, a description of the overlapping configuration will be omitted.

Referring to FIG. 5, the pixel defining layer PDL may also be partially disposed in the transmissive area TA. In this case, the pixel defining layer PDL may block the diffracted laser L among the lasers L incident to the transmissive area TA in a relatively wider range than that of the pixel defining layer PDL of FIG. 4.

In some embodiments, a first length D1, which is a portion overlapping the transmissive area TA among the ends of the pixel defining layer PDL, may be about 2 micrometers or less. In this case, the pixel defining layer PDL may effectively block the diffracted laser L while securing the transmittance of the transmissive area TA.

Figure 6:
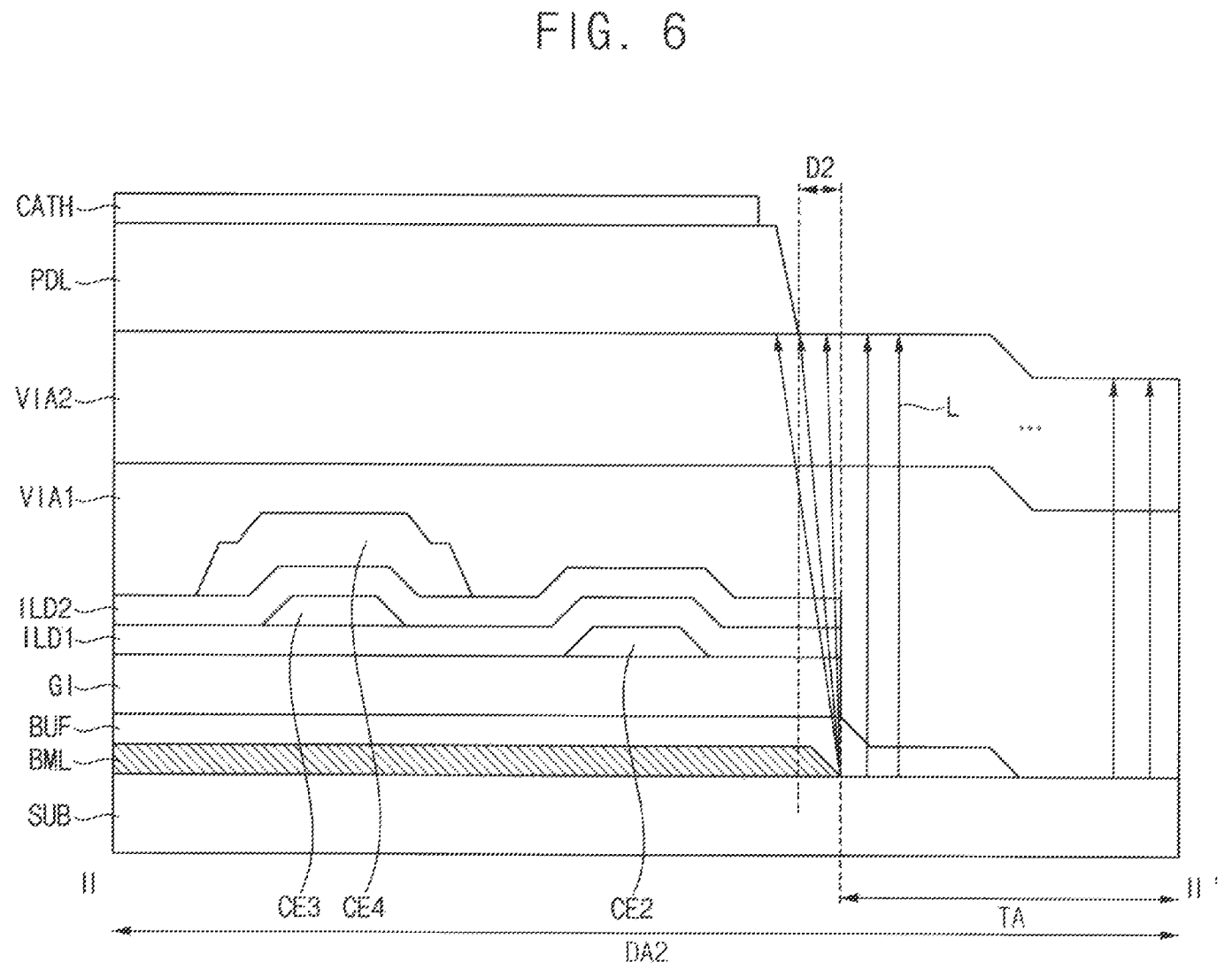

FIG. 6 is a cross-sectional view illustrating an embodiment of a cross-section taken along line II-II' of FIG. 2. FIG. 6 may be substantially the same as FIG. 4 except that an end of the pixel defining layer PDL is spaced apart from the transmissive area TA. Accordingly, a description of the overlapping configuration will be omitted.

Referring to FIG. 6, an end of the pixel defining layer PDL may overlap the second display area DA2 and be spaced apart from the transmissive area TA by a second length D2. The second length D2 may be about 2 micrometers or less. In this case, even when the end of the pixel defining layer PDL is further formed in the transmissive area TA direction due to a process error, the pixel defining layer PDL may not overlap the transmissive area TA. Accordingly, it is possible to prevent a decrease in transmittance of the transmission area TA even when a process error occurs.

Figure 7:
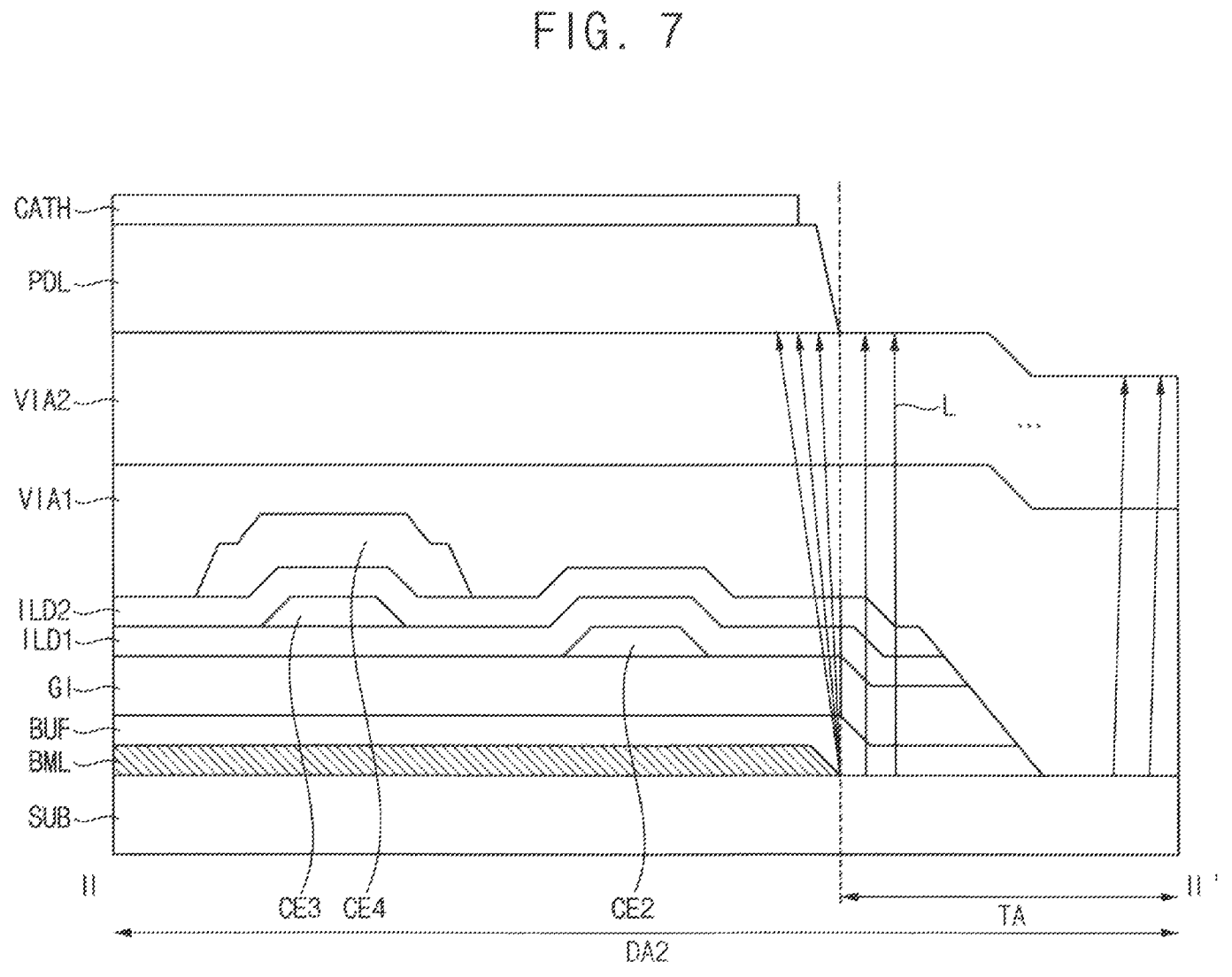

FIG. 7 is a cross-sectional view illustrating an embodiment of a cross-section taken along line II-II' of FIG. 2. FIG. 7 may be substantially the same as FIG. 4, except that the insulating layers GI, ILD1, ILD2 are also partially disposed in the transmissive area TA. Accordingly, a description of the overlapping configuration will be omitted.

Figure 8:
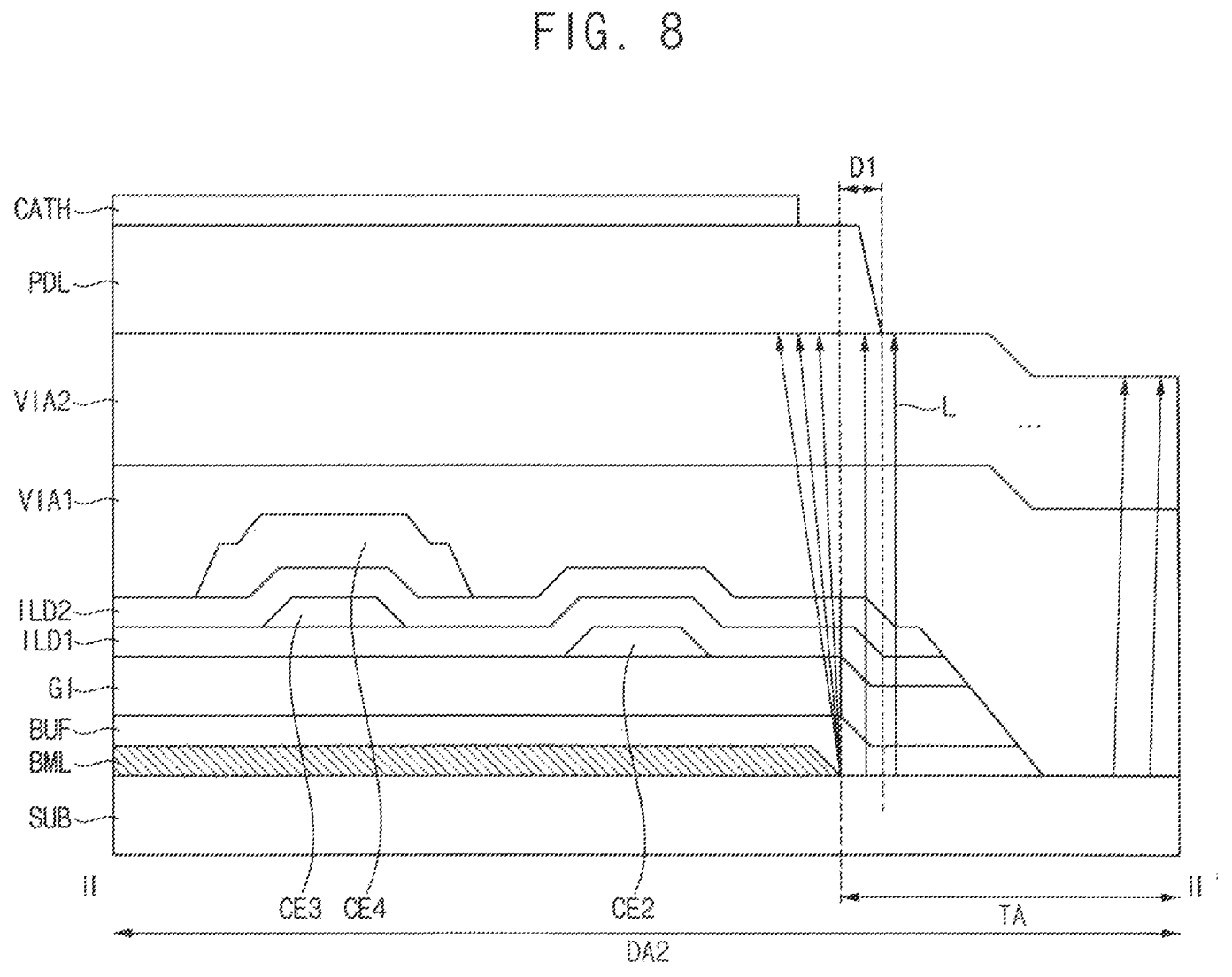

FIG. 8 is a cross-sectional view illustrating an embodiment of a cross-section taken along line II-II' of FIG. 2. FIG. 8 may be substantially the same as FIG. 5, except that the insulating layers GI, ILD1, ILD2 are also partially disposed in the transmissive area TA. Accordingly, a description of the overlapping configuration will be omitted.

Figure 9:
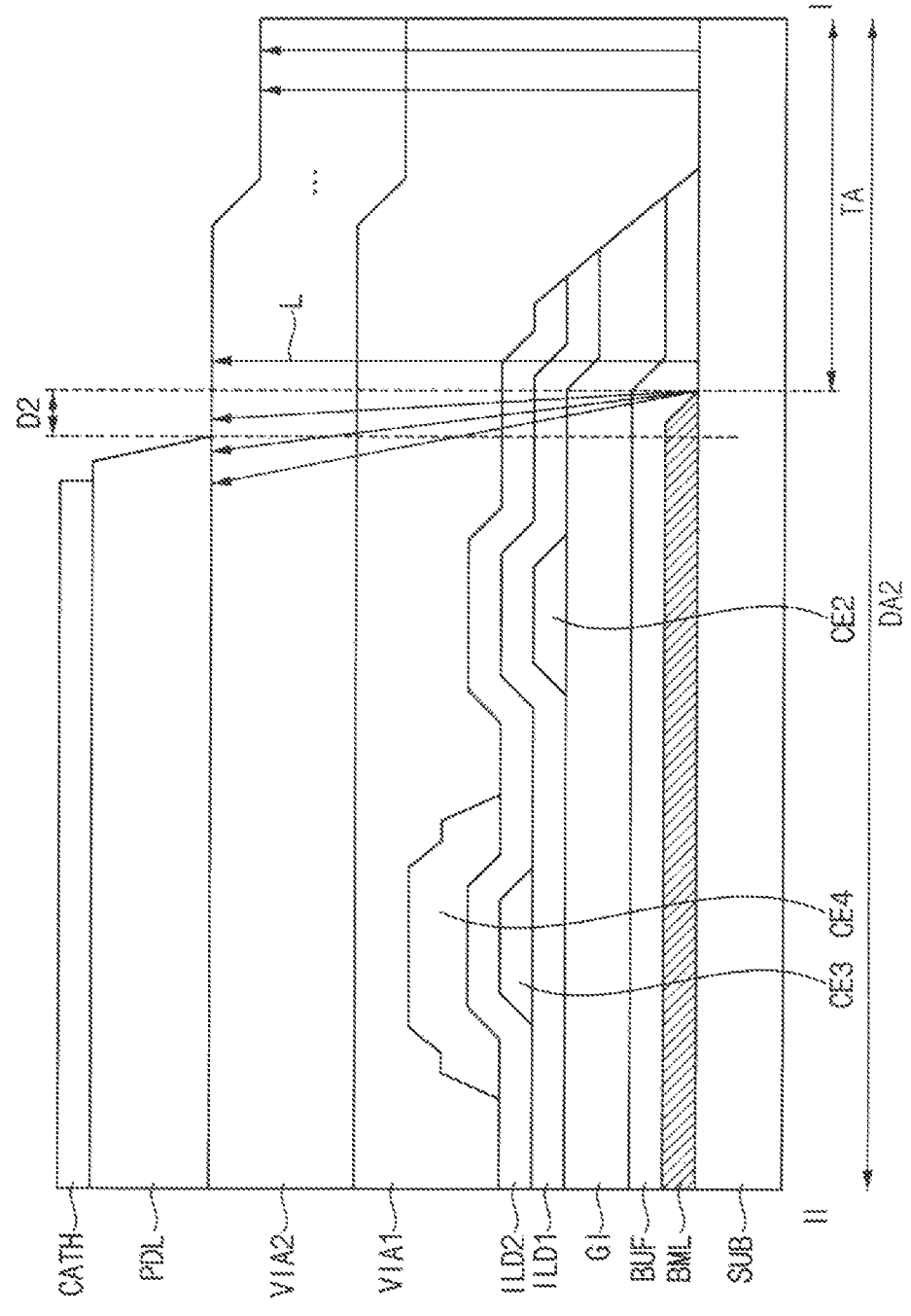
FIG. 9 is a cross-sectional view illustrating an embodiment of a cross-section taken along line II-II' of FIG. 2.

FIG. 9 is a cross-sectional view illustrating an embodiment of a cross-section taken along line II-II' of FIG. 2. FIG. 9 may be substantially the same as FIG. 6, except that the insulating layers GI, ILD1, ILD2 are also partially disposed in the transmissive area TA. Accordingly, a description of the overlapping configuration will be omitted.

FIGS. 10, 11, 12 and 13 are cross-sectional views illustrating an embodiment in which a laser is irradiated to a cathode electrode.

Figure 11:
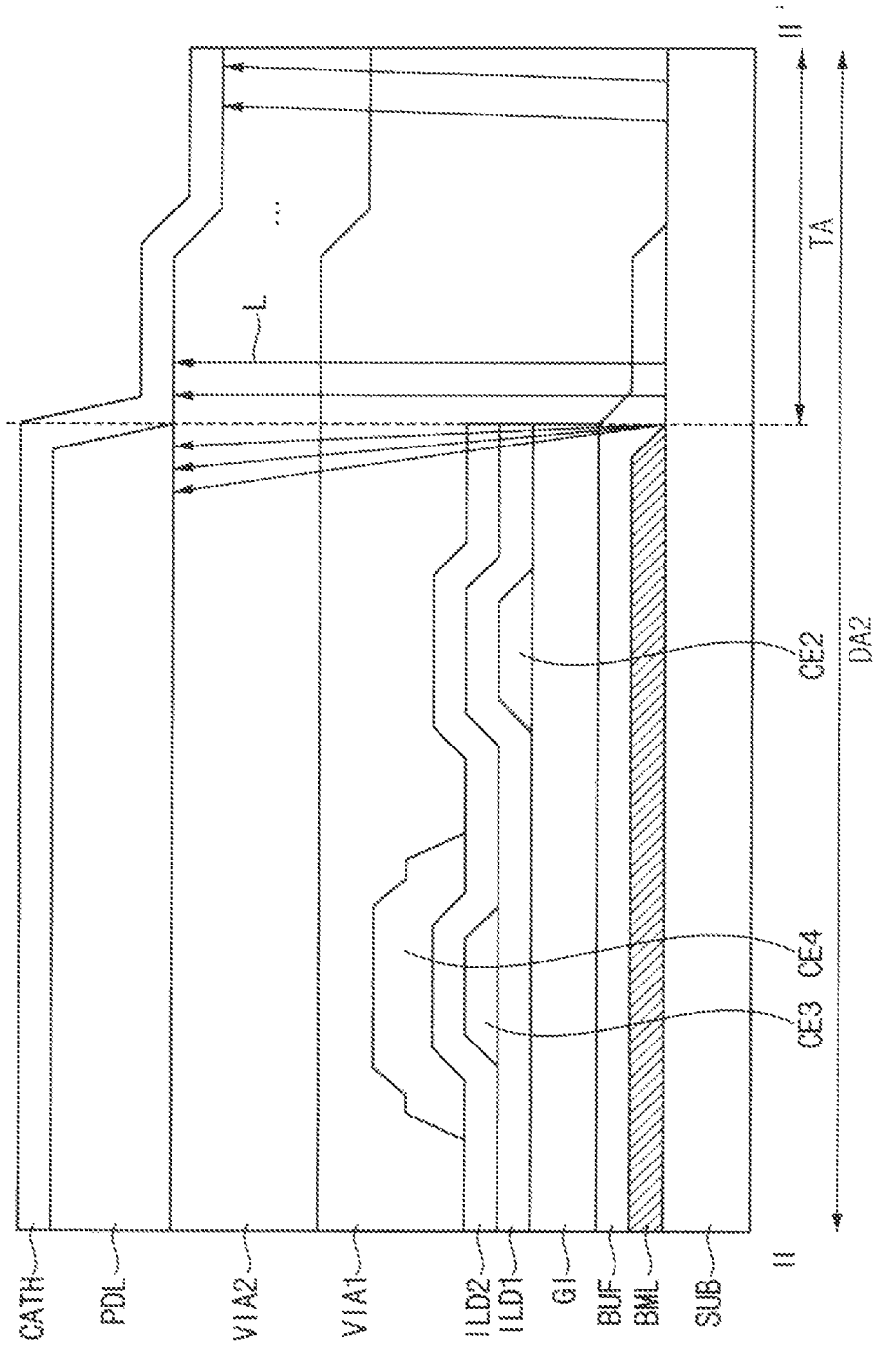

Referring to FIGS. 10 and 11, The cathode electrode CATH may also be formed in the transmissive area TA due to the characteristics of the process in which the cathode electrode CATH is formed. In this case, the cathode electrode CATH may reduce the transmittance of the transmissive area TA. Accordingly, the laser device irradiates a separate laser L to remove a portion of the cathode electrode CATH that overlaps the transmissive area TA.

Figure 13:
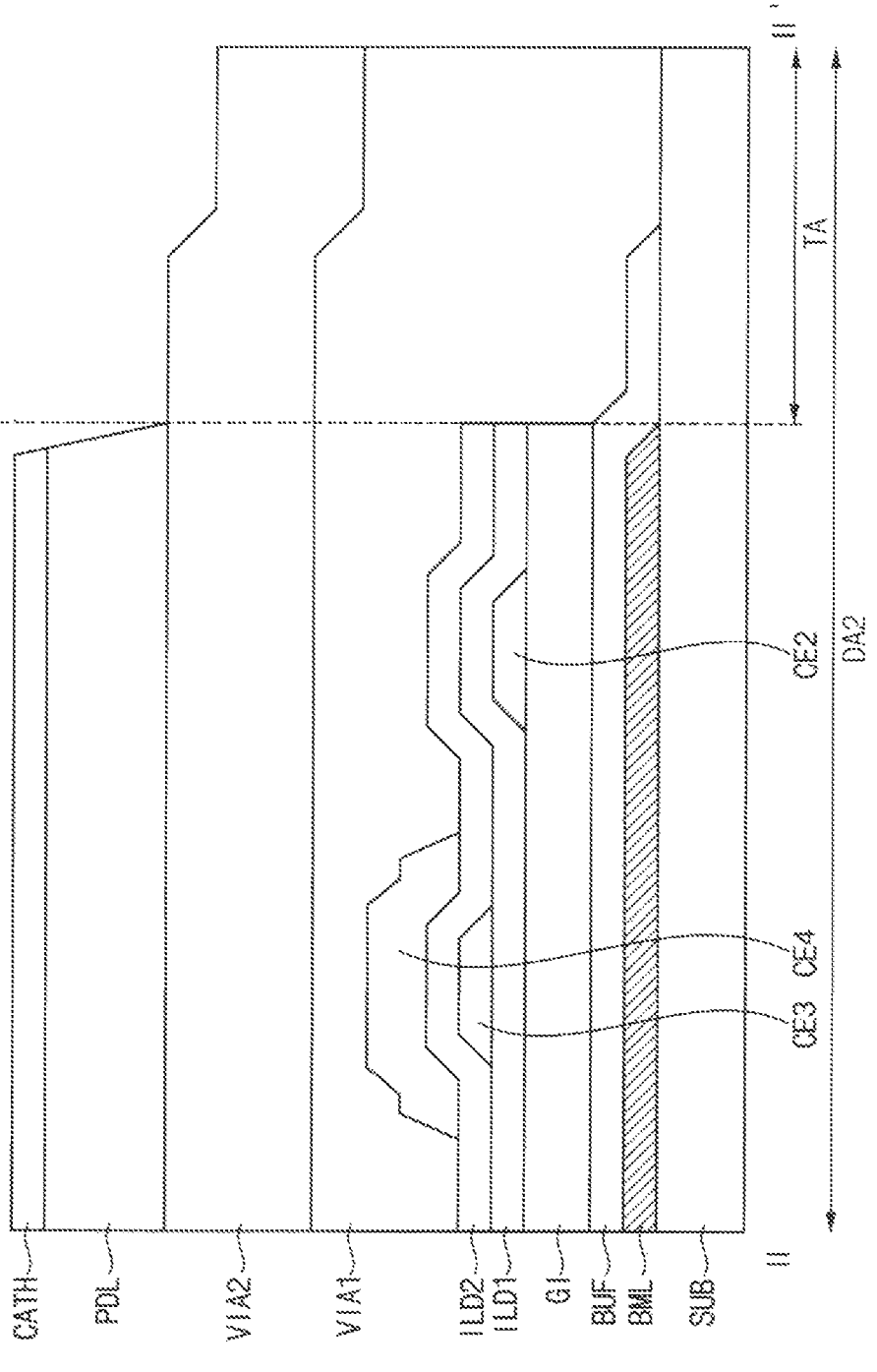

Referring to FIGS. 12 and 13, the portion to which the laser L is irradiated to the cathode electrode CATH may be removed by the laser. Accordingly, as illustrated in FIG. 13, the cathode electrode CATH does not remain in the transmissive area TA, so that the display device may secure transmittance in the transmissive area TA.

Figure 14:
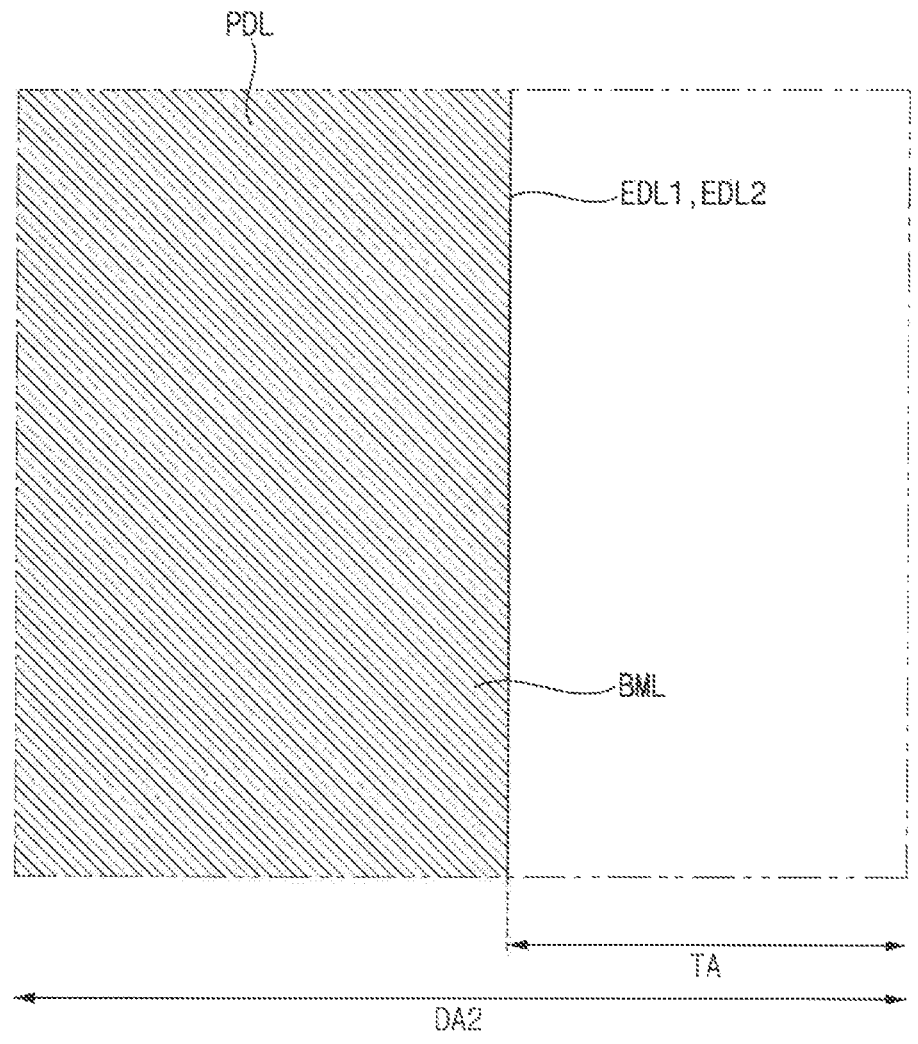
FIGS. 14, 15, and 16 are plan views schematically illustrating an area adjacent to line II-II' of FIG. 2.
Figure 15:
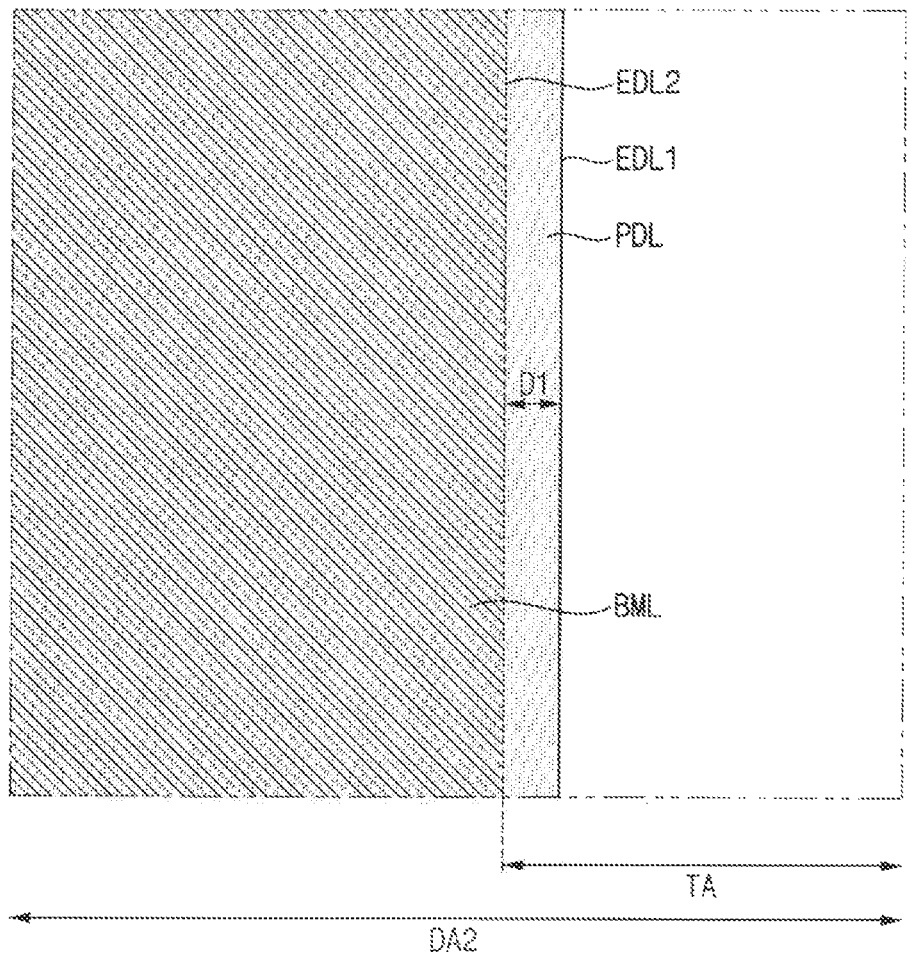
Figure 16:
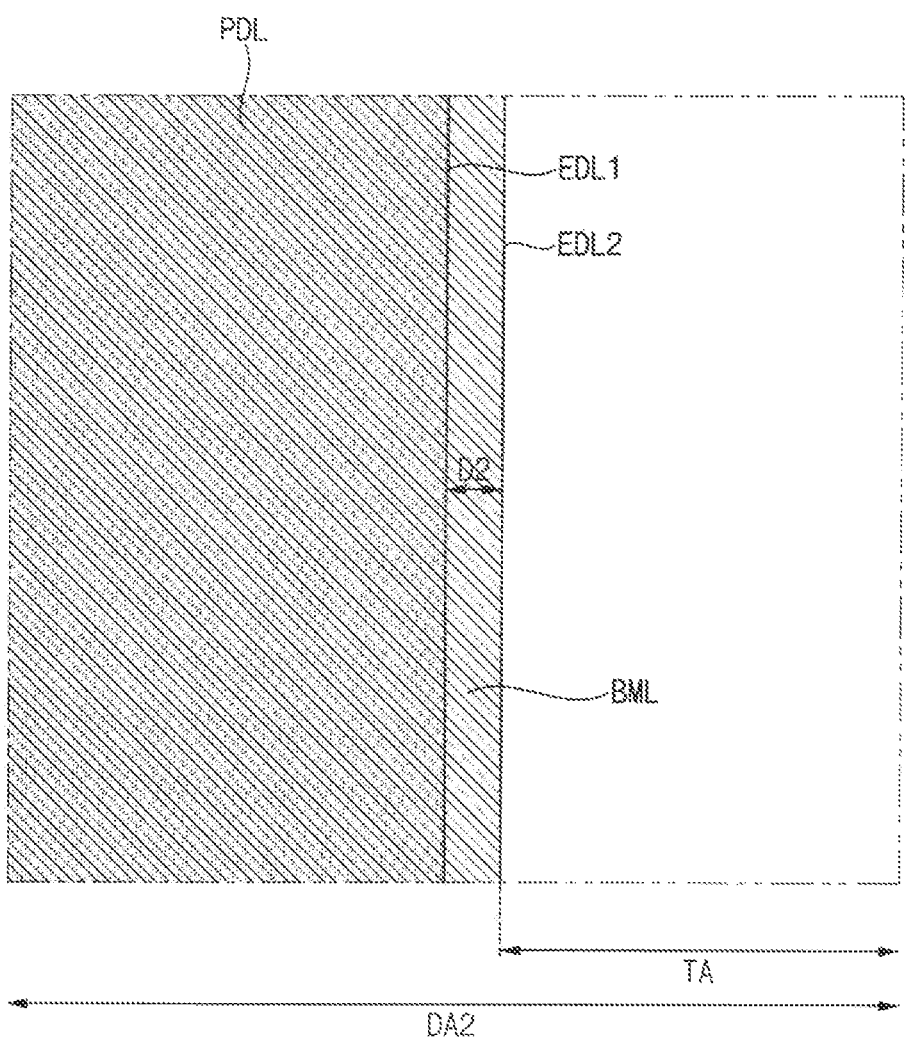

FIGS. 14, 15, and 16 are plan views schematically illustrating an area adjacent to line II-II' of FIG. 2.

Referring to FIGS. 4 and 14, the conductive layer BML may be disposed in the second display area DA2. The conductive layer BML may serve to block incident light. Accordingly, the second display area DA2 and the transmissive area TA may be divided by the conductive layer BML. That is, an end EDL2 of the conductive layer BML may correspond to the boundary between the second display area DA2 and the transmissive area TA.

The pixel defining layer PDL may be disposed to overlap the conductive layer BML in a plan view. An end EDL1 of the pixel defining layer PDL may coincide with the end EDL2 of the conductive layer BML.

A cathode electrode CATH may be disposed on the pixel defining layer PDL. The cathode electrode CATH may be generally disposed in the second display area DA2 and the transmissive area TA by a deposition process. Thereafter, the cathode electrode CATH disposed in the transmissive area TA may be removed by the laser incident from the transmissive area TA. In this case, the laser may be diffracted by the conductive layer BML. An intensity of the diffracted laser may be weaker than that of the non-diffracted laser. Accordingly, the cathode electrode CATH may not be completely removed by the diffracted laser. In this case, a residue of the cathode electrode CATH may remain, which may cause a defect in the display device. Accordingly, in order to prevent the diffracted laser from proceeding to the cathode electrode CATH, the pixel defining layer PDL needs to block the diffracted laser. The pixel defining layer PDL according to the embodiments is disposed to overlap the conductive layer BML on the conductive layer BML, so that the pixel defining layer PDL may block the diffracted laser from the end EDL2 of the conductive layer BML.

Referring to FIGS. 5 and 15, the pixel defining layer PDL may be disposed in the transmissive area TA while covering the conductive layer BML in a plan view. In this case, the distance D1 between the end EDL1 of the pixel defining layer PDL and the end EDL2 of the conductive layer BML may be within about 2 μm.

Referring to FIGS. 6 and 16, the pixel defining layer PDL may be disposed to cover the conductive layer BML and be spaced apart from the transmissive area TA in a plan view. Even in this case, the distance D1 between the end EDL1 of the pixel defining layer PDL and the end EDL2 of the conductive layer BML may be within about 2 μm.

FIG. 16 may be substantially the same as FIG. 14, except that the end EDL1 of the pixel defining layer PDL is spaced apart from the end EDL2 of the conductive layer BML by the transmissive area TA. Accordingly, a description of the overlapping configuration will be omitted. In this case, in a plan view, the end EDL1 of the pixel defining layer PDL may be spaced apart from the transmissive area TA by about 2 μm from the end EDL2 of the conductive layer BML.

As such, in a plan view, the end EDL1 of the pixel defining layer PDL may be disposed adjacent to the end EDL2 of the conductive layer BML. Accordingly, the laser diffracted by the end EDL2 of the conductive layer BML may be blocked by the pixel defining layer PDL and thus may not reach the cathode electrode CATH.

Figure 17:
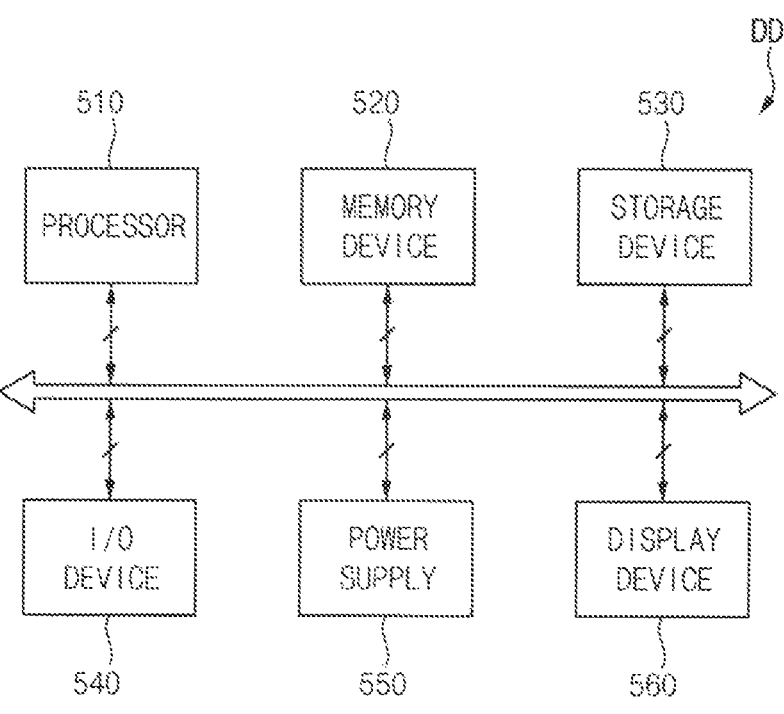
FIG. 17 is a block view illustrating an electronic device according to an embodiment.
Figure 18:
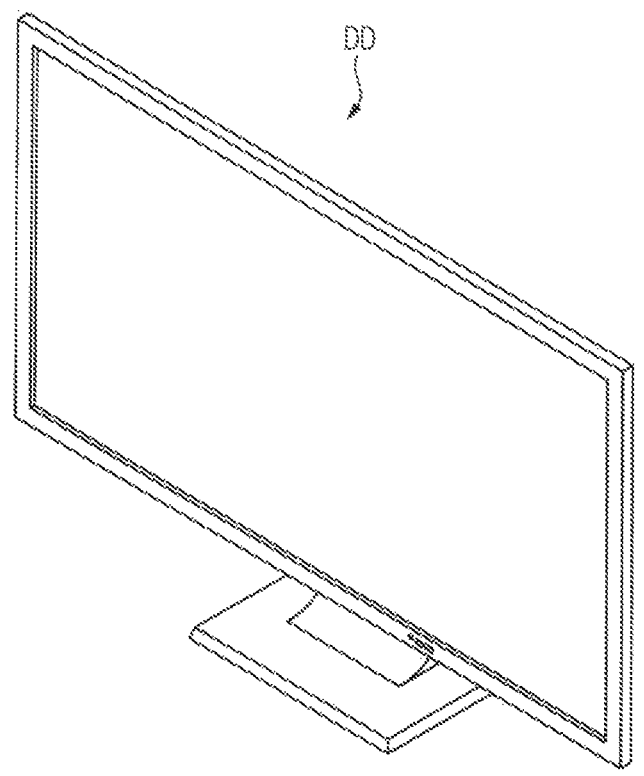
FIG. 18 is a view illustrating an embodiment in which the electronic device of FIG. 17 is implemented as a television.
Figure 19:
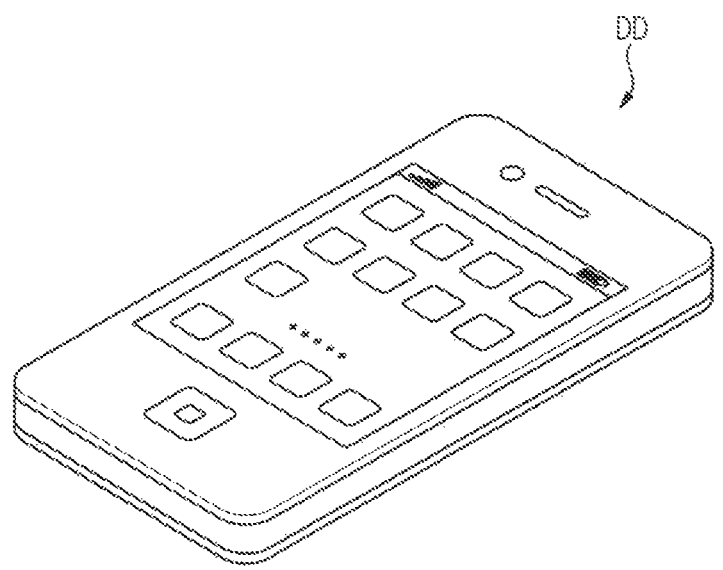
FIG. 19 is a view illustrating an embodiment in which the electronic device of FIG. 17 is implemented as a smart-phone.

FIG. 17 is a block view illustrating an electronic device according to an embodiment, FIG. 18 is a view illustrating an embodiment in which the electronic device of FIG. 17 is implemented as a television, and FIG. 19 is a view illustrating an embodiment in which the electronic device of FIG. 17 is implemented as a smartphone.

Referring to FIGS. 17, 18 and 19, an embodiment of an electronic device DD may include a processor 510, a memory device 520, a storage device 530, an input/output device 540, a power supply 550, and a display device 560. In such an embodiment, the display device 560 may correspond to the display device described above with reference to the above drawings. The electronic device DD may further include several ports capable of communicating with a video card, a sound card, a memory card, a USB device, and the like. In an embodiment, as illustrated in FIG. 16, the electronic device DD may be implemented as a television. In an alternative embodiment, as illustrated in FIG. 17, the electronic device DD may be implemented as a smartphone. However, the electronic device DD is not limited thereto, and for example, the electronic device DD includes a mobile phone, a video phone, a smart pad, a smart watch, a tablet PC, a vehicle navigation system, it may be implemented as a computer monitor, notebook computer, head mounted display ("HMD"), or the like.

The processor 510 may perform specific calculations or tasks. In an embodiment, the processor 510 may be a micro processor, a central processing unit ("CPU"), an application processor ("AP"), or the like. The processor 510 may be connected to other components through an address bus, a control bus, a data bus, or the like. In an embodiment, the processor 510 may also be connected to an expansion bus such as a peripheral component interconnect ("PCI") bus.

The memory device 520 may store data used for the operation of the electronic device DD. In one embodiment, for example, the memory device 520 may include nonvolatile memory device such as an erasable programmable read-only memory ("EPROM") device, an electrically erasable programmable read-only memory ("EEPROM") device, a flash memory device, and a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, and/or volatile memory device such as a dynamic random access memory ("DRAM") device, a static random access memory ("SRAM") device, a mobile DRAM device.

The storage device 530 may include a solid state drive ("SSD"), a hard disk drive ("HDD"), a CD-ROM, or the like. The input/output device 540 may include an input means such as a keyboard, a keypad, a touch pad, a touch screen, and a mouse, and an output means such as a speaker and a printer.

The power supply 550 may supply power required for the operation of the electronic device DD. The display device

560 may be coupled to other components via buses or other communication links. According to an embodiment, the display device 560 may be included in the input/output device 540.

Although embodiments and implementations have been described herein, other embodiments and modifications will be apparent from this description. Accordingly, the present inventive concept is not limited to such embodiments, but rather to the broader scope and spirit of the appended claims and various obvious modifications and equivalent arrangements as would be apparent to a person of ordinary skill in the art.

What is claimed is:

1. A display device comprising:
a substrate that includes a first display area including pixels, a second display area including the pixels, and a transmissive area formed between the pixels of the second display area;
a driving element disposed on the first display area and the second display area of the substrate
a conductive layer disposed in the second display area outside of the transmissive area, a boundary between the transmissive area and the second display area being determined by the conductive layer, wherein the conductive layer overlaps the driving element and is disposed between the substrate and the driving element to prevent deterioration of the driving element; and
a pixel defining layer overlapping the conductive layer and disposed such that an end of the pixel defining layer adjacent to the transmissive area is substantially aligned with an end of the conductive layer adjacent to the transmissive area,
wherein the end of the pixel defining layer protrudes into the transmissive area relative to a line extending at a right angle from the substrate aligned with the end of the conductive layer.

2. The display device of claim 1, wherein the pixel defining layer includes a black organic pigment.

3. The display device of claim 1, wherein a length of a portion from which the end of the pixel defining layer protrudes is no more than about 2 micrometers.

4. The display device of claim 1, further comprising:
a cathode electrode disposed on the pixel defining layer to overlap the second display area and not to overlap the transmissive area.

5. The display device of claim 1, further comprising:
a plurality of inorganic insulating layers disposed on the conductive layer to overlap the second display area and not to overlap the transmissive area.

6. The display device of claim 1, further comprising:
a plurality of inorganic insulating layers disposed on the conductive layer to overlap the second display area and extending so that an end thereof overlaps a portion of the transmissive area.

7. The display device of claim 1, further comprising:
a first inorganic insulating layer disposed on the conductive layer to overlap the second display area and extending so that an end of the first inorganic insulating layer overlaps a portion of the transmissive area; and
a second inorganic insulating layer disposed on the first inorganic insulating layer to overlap the second display area and not overlapping the transmissive area.

8. The display device of claim 1, further comprising:
a light emitting element disposed on the driving element and electrically connected to the driving element.

9. The display device of claim 2, wherein the black organic pigment includes a lactam pigment.

10. The display device of claim 5, further comprising:

a first organic insulating layer disposed on the plurality of inorganic insulating layers to overlap the second display area and extended to overlap the transmissive area as well; and a second organic insulating layer disposed on the first organic insulating layer to overlap the second display area and the transmissive area.

11. The display device of claim 6, further comprising:

a first organic insulating layer disposed on the plurality of inorganic insulating layers to overlap the second display area and extended to overlap the transmissive area as well; and a second organic insulating layer disposed on the first organic insulating layer to overlap the second display area and the transmissive area.

12. The display device of claim 7, further comprising:

a first organic insulating layer disposed on the second inorganic insulating layers to overlap the second display area and extended to overlap the transmissive area; and a second organic insulating layer disposed on the first organic insulating layer to overlap the second display area and the transmissive area.

13. The display device of claim 8, wherein the light emitting element includes:

an anode electrode electrically connected to the driving element;

a light emitting layer disposed on the anode electrode; and a cathode electrode disposed on the light emitting layer and the pixel defining layer, overlapping the pixel defining layer in the first display area and the second display area, and not overlapping the transmissive area.

* * * * *